(12) United States Patent
Schnetker

(10) Patent No.: US 7,538,684 B2
(45) Date of Patent: May 26, 2009

(54) CIRCUIT HEALTH MONITORING SYSTEM AND METHOD

(75) Inventor: Ted R. Schnetker, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 370 days.

(21) Appl. No.: 10/920,658

(22) Filed: Aug. 18, 2004

(65) Prior Publication Data

US 2006/0038692 A1    Feb. 23, 2006

(51) Int. Cl.
G08B 21/00 (2006.01)
(52) U.S. Cl. .................. 340/653; 340/654; 340/652
(58) Field of Classification Search .................. 340/653, 340/654, 635, 661; 324/500, 519, 548, 550, 324/658; 361/15, 17
See application file for complete search history.

(56) References Cited

U.S. PATENT DOCUMENTS

| | | | | |
|---|---|---|---|---|
| 4,219,856 A | * | 8/1980 | Danfors et al. | 361/15 |
| 4,330,777 A | * | 5/1982 | McDuff | 340/635 |
| 4,710,735 A | * | 12/1987 | Blahous et al. | 333/175 |
| 4,849,849 A | * | 7/1989 | Zucker et al. | 361/92 |
| 5,673,028 A | * | 9/1997 | Levy | 340/635 |
| 6,016,105 A | * | 1/2000 | Schweitzer, Jr. | 340/664 |
| 6,151,560 A | * | 11/2000 | Jones | 702/58 |
| 6,618,235 B1 | * | 9/2003 | Wagoner et al. | 361/118 |
| 6,775,117 B2 | * | 8/2004 | Wodrich et al. | 361/56 |

OTHER PUBLICATIONS

Derwent Abstracted Pub. No. SU 758389B, Capacitive-accumulator energy store has switching circuits in parallel with series-connected rows of capacitors, and current sensor in connecting tie.*

* cited by examiner

*Primary Examiner*—Toan N Pham
(74) *Attorney, Agent, or Firm*—Carlson, Gaskey & Olds

(57) ABSTRACT

A system and method that provides early warning of a capacitor failure before it causes a functional failure by including a plurality of redundant capacitive elements arranged in parallel in a capacitor module. A monitor measures a value corresponding to the total capacitance of the module under a selected system operating condition to obtain a baseline value. During system operation, the monitor compares a measured value with the baseline. If any of the capacitive elements in the module fails in an open state or a shorted state, the measured value will differ respect to the baseline, but the remaining capacitive elements allow the system to continue to operate. The user can therefore replace the failed capacitor as part of scheduled maintenance, reducing maintenance and operating costs caused by unexpected, unscheduled maintenance.

16 Claims, 2 Drawing Sheets

CIRCUIT HEALTH MONITORING SYSTEM AND METHOD

TECHNICAL FIELD

The present invention relates to circuit health monitoring systems and methods that detect potential failures in circuit components.

BACKGROUND OF THE INVENTION

DC or AC electric power distribution systems using local voltage and current conversion circuits are increasingly being used in aerospace, military, industrial, transportation, and other industries. In these environments, solid state inverter circuits are used to locally convert voltage and current to required levels at application sites (e.g., an airframe). These inverter circuits commonly use capacitors for waveform shaping, for protection against electromagnetic interference (EMI), high-intensity radiated fields (HIRF) and lightning, and for other functional and protective functions. Capacitors may be included in both motor control units and inverter/converter units in the system, for example.

Many industries are increasing the use of commercial off-the-shelf (COTS) hardware to meet cost and replacement part availability goals. Although COTS hardware tends to be less expensive and more readily available than custom-made parts, COTS hardware also tends to have reduced lifespan and reliability. Thus, COTS hardware including capacitors, such as those used in inverter/converter applications, may experience occasional failures as they age.

When a capacitor fails, it can fail in either a shorted state or an open state. If the capacitor fails in a shorted state, current is allowed to flow freely through the system, potentially causing functional failure of electronic devices in the system. If the capacitor fails in an open state, it degrades or eliminates the protection offered by the capacitor and can cause other functional failures as well. Capacitor failures tend to be hard-failures; that is, they can occur without warning and cause the system to be inoperable until the capacitor is replaced. For example, if the capacitor stores energy used to start an engine, failure of that capacitor will make the engine unable to start. Other problems discovered only after the capacitor failure renders a system inoperable results in unplanned delays as the failed capacitor is replaced on an ad hoc basis. In other words, current systems do not contain any operating margins for capacitor failures.

There is a desire for a system that can anticipate capacitor failures before they cause functional failures in the system.

SUMMARY OF THE INVENTION

The present invention is directed to a system and method that provides early warning of a capacitor failure before it causes a functional failure. The system includes a plurality of redundant capacitive elements or capacitors arranged in parallel in a capacitor module to carry out a desired system function (e.g., waveform shaping, system protection, etc.). A monitor measures a value corresponding to total capacitance of the module under system operating or test conditions during initial construction or installation of the module to obtain a baseline value. The monitor can be a component in the system containing the capacitive elements or can be external to the system.

After the module is installed in the system, the monitor compares the capacitance of the module with the baseline obtained during operating or test conditions. If any of the capacitors in the module fails in an open state or a shorted state, the actual capacitance of the module will be different than the baseline. However, the redundant capacitive elements allow the system to continue operating with one, or even more than one, failed capacitive element. Thus, the monitor can notify the user about the failed capacitive element without requiring the user to replace the failed capacitive element immediately. The user can therefore replace the failed capacitive element as part of scheduled maintenance, reducing maintenance and operating costs caused by unexpected, unscheduled maintenance.

These and other features of the present invention can be best understood from the following specification and drawings, the following of which is a brief description.

DETAILED DESCRIPTION OF THE PREFERRED EMBODIMENT

Figure 1:
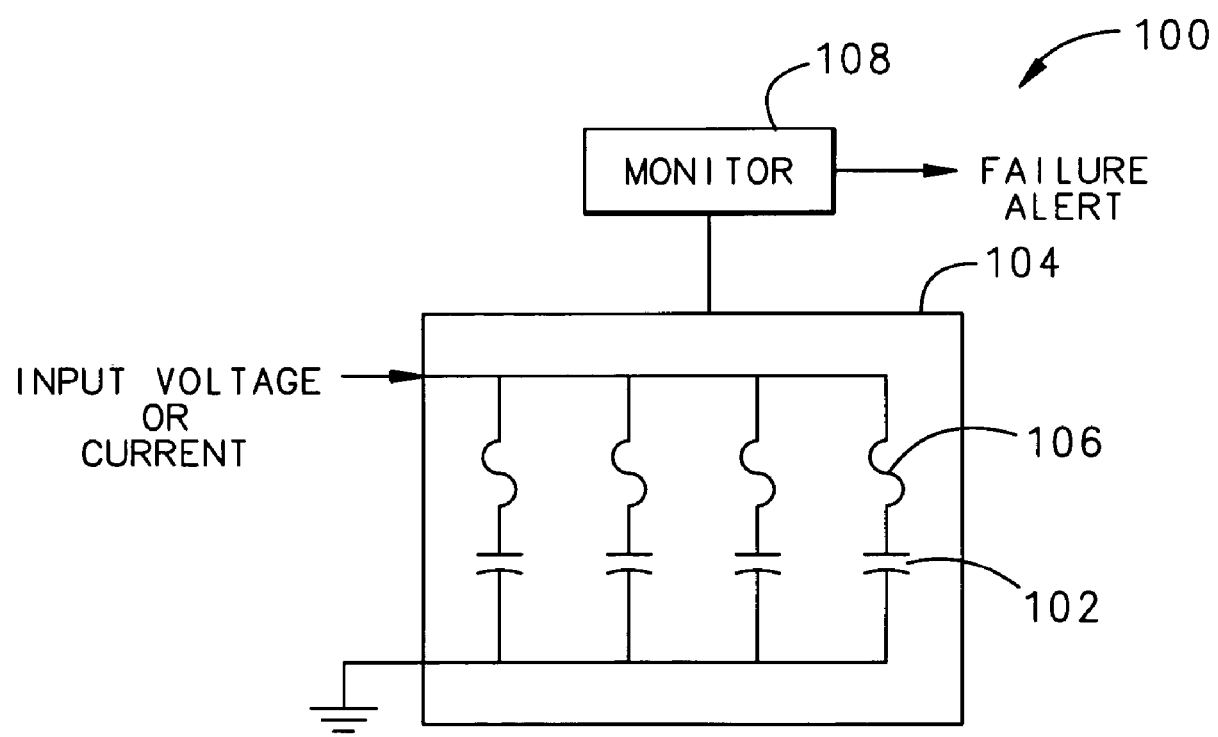
FIG. 1 is a representative diagram of a system incorporating a circuit health monitoring system according to one embodiment of the invention.

FIG. 1 illustrates a system 100 that provides fail-soft, fail-safe operation of capacitive elements 102 in the system 100. Rather than including only the minimum number of capacitors to provide system functionality (e.g., filtering, wave shaping, EMI/HIRF/lightning protection, etc.), the system 100 includes a module 104 having redundant capacitive elements or capacitive elements 102. The capacitive elements 102 in the module 104 are arranged in parallel. Note that multiple capacitive elements 102 may exist within a single capacitor; thus, the term "capacitive elements" in this description will broadly cover both individual capacitive elements as well as capacitors containing multiple capacitive elements. Using redundant capacitive elements 102 ensures that there will be sufficient capacitance to maintain at least a minimum level of system functionality even when one or more of the individual capacitive elements 102 fail.

The capacitive elements 102 in the module 104 may be connected in parallel and installed in any manner that allows rapid replacement of failed or degraded capacitive elements 102. The capacitive elements 102 may have any physical arrangement (e.g., disposed in separate housings, connected in parallel on a single length of insulating film, isolated as separate elements in a single capacitance generating unit, in a single housing, etc.) without departing from the scope of the invention.

As noted above, the capacitive element 102 may fail in an open circuit condition, which prevents current from flowing through the capacitive element 102. Further, as noted above, the capacitive element 102 may fail in a shorted condition. A current limiting device 106, such as a fuse or fusible link, may be connected to each capacitive element 102 to handle capacitor failures that would ordinarily result in a shorted condition. When current flow from an input voltage or current source 108 to a given capacitive element 102 reaches a predetermined excessive level and/or duration, the current limiting device 106 opens, breaking a connection between the source 108 and the capacitive element 102 and creating an open circuit. Thus, the current limiting device 106 ensures that the capacitive elements 102 will fail only in an open circuit condition even in circumstances that would ordinarily cause a shorted condition. Creating the open circuit condition as a default failure condition protects other components in the system 100 from damage due to excessive current flow.

Although the current limiting devices 106 are shown in FIG. 1 as being external to the capacitive elements 102 and disposed in the module 104, the current control elements 106 may be internal to the capacitive elements 102 or disposed outside the module 104 without departing from the scope of the invention. Also, the current limiting device 106 itself is not limited to a fuse, but can be any passive device or even any active circuit element (e.g., a field effect transistor) that ensures that its associated capacitive element 102 is not short-circuited for longer than the time required to open the current limiting device 106.

A monitor 108 is coupled to the module 104 to measure a value corresponding to the total capacitance value of the capacitive elements 102 in the module 104 and detect if one or more the capacitive elements 102 fails. The monitor 108 can be a capacitance monitor or any other circuit performance monitor. Note that the measured value does not need to be a capacitance value itself; instead it can be any value (e.g., capacitance charging time, waveforms, etc.) that can be affected by the capacitance of the module. Also, the monitor 108 may be self-calibrating or have a fixed calibration; that is, the monitor 108 may measure the capacitance of the module 104 against a performance baseline that is either a fixed value established for monitoring purposes or a self-generated value measured under a selected operating condition. The baseline may be obtained by the monitor 108 at any desired operating state, such as during initial construction or installation, normal system operation, scheduled maintenance testing, test procedures using external equipment, self-test procedures (e.g., built-in test procedures), or other operational and test modes of the system. The baseline itself may be, for example, a voltage or current value or a waveform.

Figure 2:
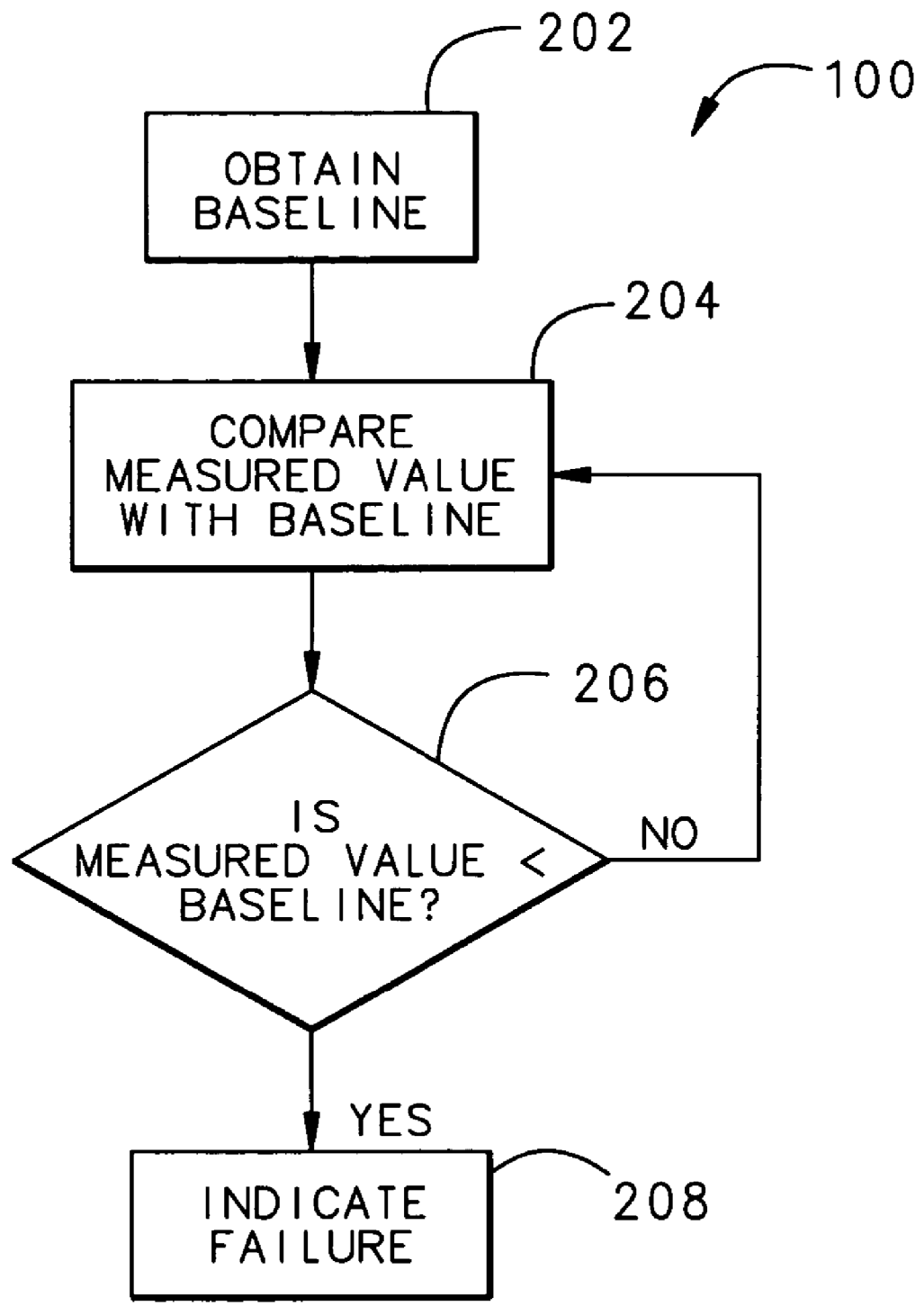
FIG. 2 is a flow diagram illustrating a method for detecting a circuit component failure according to one embodiment of the invention.

FIG. 2 illustrates a method 200 that the monitor 108 may execute when checking the performance of the module 104. Regardless of the specific way the monitor 108 obtains the baseline, the monitor 108 generally compares the baseline with an actual measured value during operation of the module 104. More particularly, once the monitor 104 obtains the baseline value (block 202), the monitor 108 compares the measured value corresponding with the total capacitance of the module 104 with the baseline (block 204). The checking may be conducted in any way and according to any schedule. For example, the monitor 108 may check the total capacitance of the module 104 internally or externally, continuously or periodically. Like the baseline measurement, the monitoring can be conducted at any desired operating state (e.g., scheduled testing, self-test, selected operational and test modes, etc.)

Failure of one or more of the capacitive elements 102 in the module 104 will cause the total capacitance of the module 104 to drop, thereby causing the measured value (e.g., voltage, current, waveform, charging time, etc.) to deviate from the baseline. For example, if one or more of the capacitive elements 102 fails in an open condition, the total capacitance of the module 104 will drop. If one or more of the capacitive elements 102 fails in a shorted condition, the increase in current will cause the corresponding current limiting device 106 to break and create an open circuit at the failed capacitor, again causing the total capacitance to drop.

The monitor 108 detects this capacitance drop (block 206) and generates an alert notifying the user that at least one capacitive element 102 has failed (block 208). Rather than requiring immediate service, however, the redundant capacitive elements 102 allow system operation to continue until the failed capacitive element 102 is replaced. The actual degree of system function available may depend on the number of capacitive elements 102 that have failed; for example, the system may operate at full functionality if only one capacitive element 102 in the module 104 fails, and may operate in a degraded performance mode or be removed from active operation as required by a given application if additional capacitive elements 102 fail. For example, if the system 100 requires only one capacitive element 102, one of the other redundant capacitive elements 102 may act as a rapid replacement for the failed capacitive element 102 without compromising system operation.

Because the user is notified before the module 104 completely stops operating, the monitor 108 allows the user to anticipate module 104 performance degradation before it reaches a degree that halts system operation. The redundant capacitive elements 102 in the module 104 allow the system 100 to continue operating while at the same time notifying the user that one or more of the capacitive elements 102 requires replacement, allowing users to schedule maintenance of the module 104 at their convenience without adversely affecting safety, reliability, and system operating scheduling. Capacitance loss can be corrected by rapid replacement of the damaged capacitive element 102 and, if desired, any associated circuits or structures that are designed as part of the module 104 or as a separate rapid maintenance module.

By incorporating redundant capacitors and a monitor that detects when one of the capacitors fails, capacitor failure does not automatically result in functional failure. Instead, the system can continue to function while at the same time alerting the user that one of the capacitors should be replaced. Thus, rather than having to replace the capacitor immediately after it fails before being able to operate the system, the user can continue to operate the system using the redundant capacitors, providing time for the user to readjust operating schedules to accommodate the capacitor replacement before actual functional failure, including loss of required EMI/HIRF/lightning protection. The invention therefore shifts capacitor replacement from an ad hoc repair to scheduled preventive maintenance, improving system availability and reducing maintenance costs.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A system comprising:
   at least two capacitive elements connected in parallel;
   at least two current control devices coupled to said at least two capacitive elements;
   a monitor that compares a measured value corresponding to a total capacitance of said at least two capacitive elements with a baseline and indicates a failed capacitive element in the system if the measured value differs from the baseline; and
   wherein the baseline is obtained by the monitor during a selected operating state of said at least two capacitive elements.

2. The system of claim 1, wherein the monitor indicates the failed capacitive element if the measured value is below the baseline.

3. The system of claim 1, wherein the baseline is a fixed value corresponding to a desired total capacitance.

4. The system of claim 1, wherein at least one of said at least two capacitive elements continues operating the system when the other of said at least two capacitive elements fails.

5. The system of claim 1, wherein said at least two current control devices include any combination of at least one of an active device and a passive device.

6. The system of claim 1, wherein said at least two capacitive elements are disposed in a module.

7. The system of claim 6, wherein said at least two current control devices are disposed in the module.

8. An electric power distribution system, comprising:
   a module comprising a plurality of capacitive elements connected in parallel;
   a plurality of current control devices, each current control device associated with one of said plurality of capacitive elements to form an open circuit if current through one of said plurality of capacitive elements exceeds at least one of a selected level and a selected duration;
   a monitor that compares a measured value corresponding to a total capacitance of said plurality of capacitive elements with a baseline and indicates a failed capacitive element in the system if the measured value falls below the baseline; and wherein the baseline is obtained by the monitor during a selected operating state of said at least two capacitive elements.

9. The system of claim 8, wherein the baseline is a fixed value corresponding to a desired total capacitance.

10. The system of claim 8, wherein said plurality of current control devices include any combination of at least one of an active device and a passive device.

11. The system of claim 8, wherein said plurality of current control devices are disposed in the module.

12. A method of monitoring a circuit, comprising: a monitor for obtaining a baseline corresponding to a total capacitance of a module having a plurality of capacitive elements connected in parallel, where said obtainina step is conducted durina a selected operating state of the module;
   comparing a measured value with the baseline; and
   indicating a failed capacitive element in the circuit if the measured value differs from the baseline.

13. The method of claim 12, wherein the obtaining step comprises selecting a fixed value corresponding to the desired total capacitance.

14. The method of claim 12, wherein the comparing step is conducted during a selected operating state of the module.

15. The method claim 12, wherein the selected operating state is at least one selected from the group of initial system construction, system installation, normal system operation, scheduled maintenance testing, a test procedure with external equipment, and a self-test procedure.

16. The method of claim 12, further comprising interrupting current flow through one of said plurality of capacitive elements when said one failed capacitive element fails, and continuing operation through another of said plurality of capacitive elements.

* * * * *

UNITED STATES PATENT AND TRADEMARK OFFICE
CERTIFICATE OF CORRECTION

PATENT NO. : 7,538,684 B2
APPLICATION NO. : 10/920658
DATED : May 26, 2009
INVENTOR(S) : Schnetker Page 1 of 1

It is certified that error appears in the above-identified patent and that said Letters Patent is hereby corrected as shown below:

IN THE CLAIMS:

Claim 12, Column 6, Line 9: Change "obtainina" to "obtaining"

Claim 12, Column 6, Line 10: Change "durina" to "during"

Signed and Sealed this

Eleventh Day of August, 2009

David J. Kappos
*Director of the United States Patent and Trademark Office*